US012621948B2

(12) United States Patent
Haffner

(10) Patent No.: US 12,621,948 B2
(45) Date of Patent: May 5, 2026

(54) RACK POWER DISTRIBUTION UNIT WITH CONFIGURABLE PHASE CONTROL

(71) Applicant: SCHNEIDER ELECTRIC IT CORPORATION, Foxboro, MA (US)

(72) Inventor: Joshua Thomas Haffner, Saint Louis, MO (US)

(73) Assignee: SCHNEIDER ELECTRIC IT CORPORATION, Foxboro (MA)

( * ) Notice: Subject to any disclaimer, the term of this patent is extended or adjusted under 35 U.S.C. 154(b) by 239 days.

(21) Appl. No.: 18/229,012

(22) Filed: Aug. 1, 2023

(65) Prior Publication Data

US 2025/0048580 A1 Feb. 6, 2025

(51) Int. Cl.
*H05K 7/14* (2006.01)

(52) U.S. Cl.
CPC ................................. *H05K 7/1457* (2013.01)

(58) Field of Classification Search
CPC .................................................... H05K 7/1457
USPC ......................................................... 361/622
See application file for complete search history.

(56) References Cited

U.S. PATENT DOCUMENTS

| | | | | | |
|---|---|---|---|---|---|
| 6,310,412 | B1 | | 10/2001 | Tamarkin | |
| 7,116,550 | B2 * | | 10/2006 | Ewing ..................... | H01H 85/30 |
| | | | | | 337/186 |
| 7,400,493 | B2 * | | 7/2008 | Ewing ..................... | H01R 25/00 |
| | | | | | 361/623 |

| | | | | | |
|---|---|---|---|---|---|
| 7,457,106 | B2 * | 11/2008 | Ewing ...................... | H02B 1/20 |
| | | | | 439/55 |
| 8,587,950 | B2 | 11/2013 | Ewing et al. | |
| 9,231,358 | B1 * | 1/2016 | Schow ............... | H01R 13/6335 |
| 9,438,012 | B2 * | 9/2016 | Mills .......................... | G06F 1/26 |
| 9,727,100 | B1 | 8/2017 | Eaton | |
| 10,348,063 | B2 * | 7/2019 | Ewing ...................... | H02B 1/06 |
| 10,952,344 | B1 | 3/2021 | Jiang et al. | |
| 2003/0155815 | A1 * | 8/2003 | Olesiewicz ........... | H02M 7/003 |
| | | | | 307/149 |
| 2005/0094336 | A1 | 5/2005 | Cleveland | |
| 2016/0352081 | A1 * | 12/2016 | Ewing .................... | H05K 13/00 |
| 2017/0047772 | A1 * | 2/2017 | Wang .................. | H05K 7/1492 |
| 2017/0149243 | A1 * | 5/2017 | Dozier ..................... | G06F 1/26 |
| 2019/0386468 | A1 * | 12/2019 | Ewing ................. | H05K 1/0262 |

OTHER PUBLICATIONS

Extended European Search Report from corresponding European Application No. 24188965.8 dated Feb. 24, 2025.

* cited by examiner

*Primary Examiner* — Anatoly Vortman
(74) *Attorney, Agent, or Firm* — FIG. 1 Patents

(57) ABSTRACT

According to at least one aspect of the present disclosure a power distribution unit (PDU) is provided, the PDU comprising: a phase selection interface having: a first source contact configured to couple to a configuration system, a first return contact configured to couple to the configuration system, a second source contact configured to couple to the configuration system, and a second return contact configured to couple to the configuration system; a first outlet having: a first supply opening coupled to the first source contact, and a first return opening coupled to the first return contact; and a second outlet having: a second supply opening coupled to the second source contact, and a second return opening coupled to the second return contact.

14 Claims, 6 Drawing Sheets

RACK POWER DISTRIBUTION UNIT WITH CONFIGURABLE PHASE CONTROL

BACKGROUND

1. Field of the Disclosure

At least one example in accordance with the present disclosure relates generally to power-distribution systems.

2. Discussion of Related Art

Power-distribution units, such as power strips, may provide power to one or more loads at a time. Power distribution units may have additional functionality, such as monitoring hardware and software, ethernet connectivity to facilitate remote monitoring of power conditions, and so forth.

SUMMARY

According to at least one aspect of the present disclosure a power distribution unit (PDU) is provided, the PDU comprising: a phase selection interface having: a first source contact configured to couple to a configuration system, a first return contact configured to couple to the configuration system, a second source contact configured to couple to the configuration system, and a second return contact configured to couple to the configuration system; a first outlet having: a first supply opening coupled to the first source contact, and a first return opening coupled to the first return contact; and a second outlet having: a second supply opening coupled to the second source contact, and a second return opening coupled to the second return contact.

In some examples, the configuration system is configured to conductively link at least one source contact to at least one input configured to provide a phase of input power. In some examples, the configuration system is configured to conductively link at least one return contact to at least one input configured to provide a phase of input power. In some examples, the configuration system is configured to conductively link at least one source contact or at least one return contact to a neutral or ground node. In some examples, the PDU further comprises one or more additional outlets, each additional outlet having a supply opening coupled to a source contact of the phase selection interface and a return opening coupled to a return contact of the phase selection interface. In some examples, the PDU further comprises one or more additional outlets in addition to the first outlet and the second outlet, wherein a total number of outlets of the PDU equals an integer multiple of a total number of phases of input power received by the PDU. In some examples, the total number of phases of input power is three and the total number of outlets of the PDU is a multiple of three. In some examples, each outlet comprises a first receptacle and a second receptacle, each respective first receptacle including a respective supply opening, and each respective second receptacle including a respective return opening. In some examples, each receptacle includes three openings.

According to at least one aspect of the present disclosure a method of routing power through a power distribution unit (PDU) is provided, the method comprising: providing a first source contact coupled to a first supply opening of a first outlet of the PDU; providing a first return contact coupled to a first return opening of the first outlet; providing a second source contact coupled to a second supply opening of a second outlet of the PDU; providing a second return contact coupled to a second return opening of the second outlet; and providing an interface containing the first source contact, the first return contact, the second source contact, and the second return contact, the interface being configured to be coupled to a configuration system configured to link at least one of the first source contact, the first return contact, the second source contact, and the second return contact to an input configured to provide a first phase of input power.

In some examples, the configuration system is further configured to link at least one of the first source contact, the first return contact, the second source contact, and the second return contact to a second input configured to provide a second phase of input power. In some examples, coupling the configuration system to the interface includes providing one or more modular printed circuit boards (PCBs) compatible with the interface, the one or more modular PCBs containing a plurality of conductive traces configured to link one or more of the first source contact, the first return contact, the second source contact, and the second return contact to the first phase of input power. In some examples, the method further comprises providing at least one source contact for each phase of input power, at least one return contact for each phase of input power, and at least one outlet for each phase of input power. In some examples, a number of outlets of the PDU is an integer multiple of a number of phases of input power received by the PDU.

According to at least one aspect of the present disclosure, a system for distributing multiphase power in a balanced manner is provided, the system comprising: a plurality of contacts configured to be coupled to a multiphase power source, the plurality of contacts including a first group of one or more contacts and a second group of one or more contacts; a first plurality of outlets coupled to at least two contacts of the plurality of contacts; an interface coupled to the plurality of contacts and configured to be coupled to a configuration system selectively couplable to the contacts of the plurality of contacts.

In some examples, the system further comprises the configuration system, the configuration system being configured to link each contact to at least one input configured to provide at least one phase of input power. In some examples, the system further comprises a second plurality of outlets coupled to at least two contacts of the plurality of contacts. In some examples, the first plurality of outlets and the second plurality of outlets include an equal number of outlets. In some examples, the first plurality of outlets includes at least one outlet for each contact of the first group of contacts and wherein each respective outlet of the first plurality of outlets is coupled to a respective contact of the first group of contacts and a respective contact of the second plurality of contacts. In some examples, each outlet of the first plurality of outlets includes at least two receptacles, and each receptacle includes at least one opening.

BRIEF DESCRIPTION OF THE DRAWINGS

Various aspects of at least one embodiment are discussed below with reference to the accompanying figures, which are not intended to be drawn to scale. The figures are included to provide an illustration and a further understanding of the various aspects and embodiments, and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

DETAILED DESCRIPTION

Examples of the methods and systems discussed herein are not limited in application to the details of construction and the arrangement of components set forth in the following description or illustrated in the accompanying drawings. The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including." "comprising." "having." "containing." "involving." and variations thereof is meant to encompass the items listed thereafter and equivalents thereof as well as additional items.

References to "or" may be construed as inclusive so that any terms described using "or" may indicate any of a single, more than one, and all of the described terms. In addition, in the event of inconsistent usages of terms between this document and documents incorporated herein by reference, the term usage in the incorporated features is supplementary to that of this document; for irreconcilable differences, the term usage in this document controls.

Power-distribution units ("PDUs") may receive power from a power source (such as single- or multi-phase power systems) and can provide the power to one or more loads. PDUs may be designed such that the loads draw power in a balanced manner in some examples. For example, in a three-phase power system, the PDU may be designed to distribute the first phase of power to a first load, the second phase of power to a second load, and the third phase of power to a third load. The outlets of the PDU may be further configured to provide the load balancing, such that no particular phase of power is under an unbalanced level of strain or loading.

Figure 1:
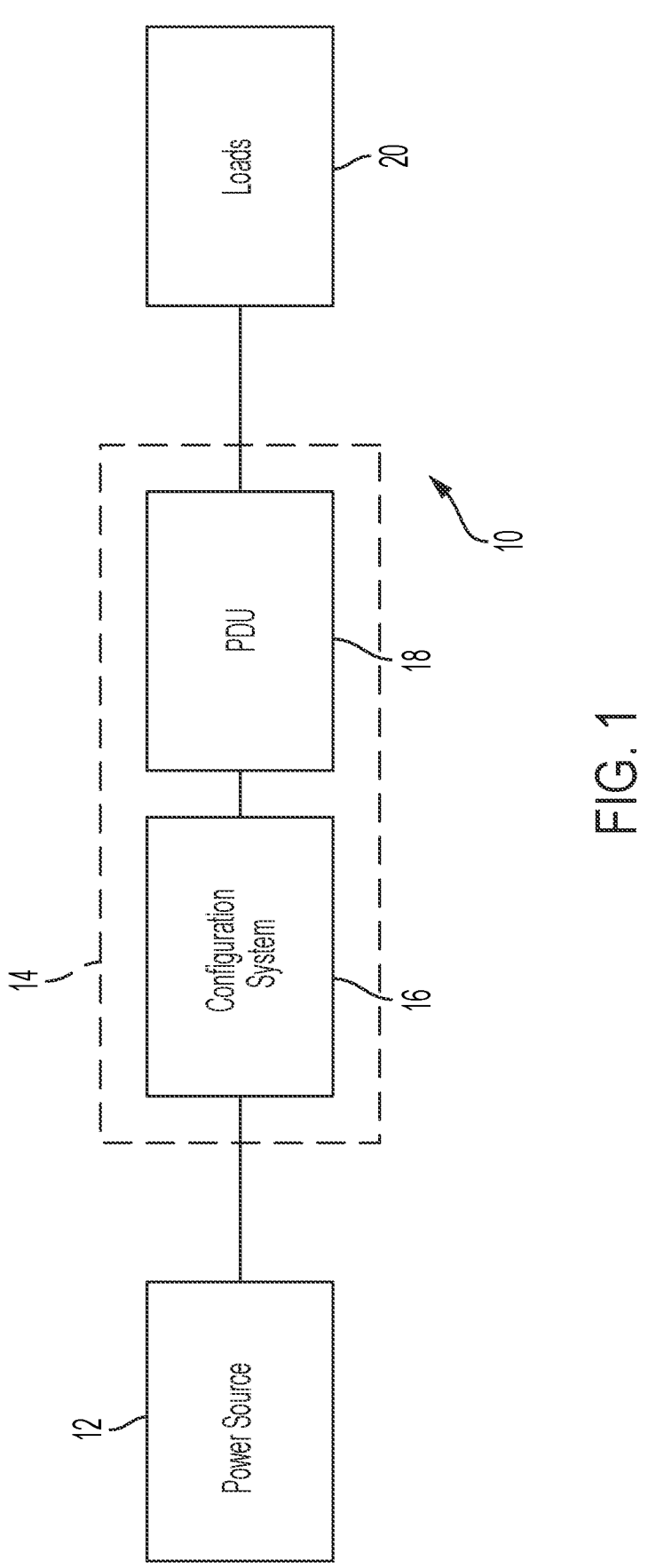
FIG. 1 illustrates a block diagram of a power system according to an example.

FIG. 1 illustrates a block diagram of a power system 10 according to an example. The power system 10 may evenly distribute power to one or more loads. In various examples, the power system 10 may be configurable. For example, the power system 10 may be modified to provide power according to different schemes (for example, with respect to three-phase power, delta and/or wye configurations).

The power system 10 includes a power source 12, a power distribution system 14 including a configuration system 16 and a power distribution unit 18 ("PDU 18"), and one or more loads 20 ("loads 20"). The power source 12 is coupled to the power distribution system 14 via the configuration system 16. The configuration system 16 is coupled to the power source 12 at a first connection and to the PDU 18 at a second connection. The PDU 18 is coupled to the configuration system 16 at a first connection and to the loads 20 at one or more second connections. The loads 20 are coupled to the power distribution system 14 via the PDU 18. In various examples, the PDU 18 is configured to distribute power evenly to the loads 20. For example, the PDU 18 may include multiple sets of several outlets. Each set of outlets may include at least one outlet that provides the same amount of power as a corresponding outlet in all of the other sets of outlets. For example, if the PDU 18 includes five sets of three outlets each, at least one of the three outlets in each of the five sets may provide the same amount of power as one another. In this example, each set of outlets contains at least one outlet that provides the same power as at least one corresponding outlet in each other set of outlets.

In some examples, the PDU 18 has a topology that accommodates multiple sets of outlets. Each set of outlets may contain one or more outlets. For example, the PDU 18 could have two sets of three outlets, three sets of four outlets, five sets of one outlet, and so forth. For any set of outlets, the first outlet in the set may be coupled to the same source and return path as the first outlet in each other set. The second outlet in the set may be coupled to the same source and return path as the second outlet in each other set, and so forth for every additional outlet.

In various examples, the number of outlets in each set may be an integer multiple of the number of phases of power provided by the power source 12. Thus, if the power source 12 provides two-phase power, the PDU could have two outlets (that is, one set), four outlets (that is, two sets), six outlets (that is, three sets), or another multiple of two worth of outlets, where each first outlet in each set is coupled to the same respective source and return path, and each second outlet in each set is coupled to the same respective source and return path. In this way, the user of the PDU 18 can be assured that any load plugged into the first outlet in any given set of outlets receives the same power as any load plugged into another first outlet in any given set of outlets. The same is true for the other outlets for each set of outlets.

Figure 2:
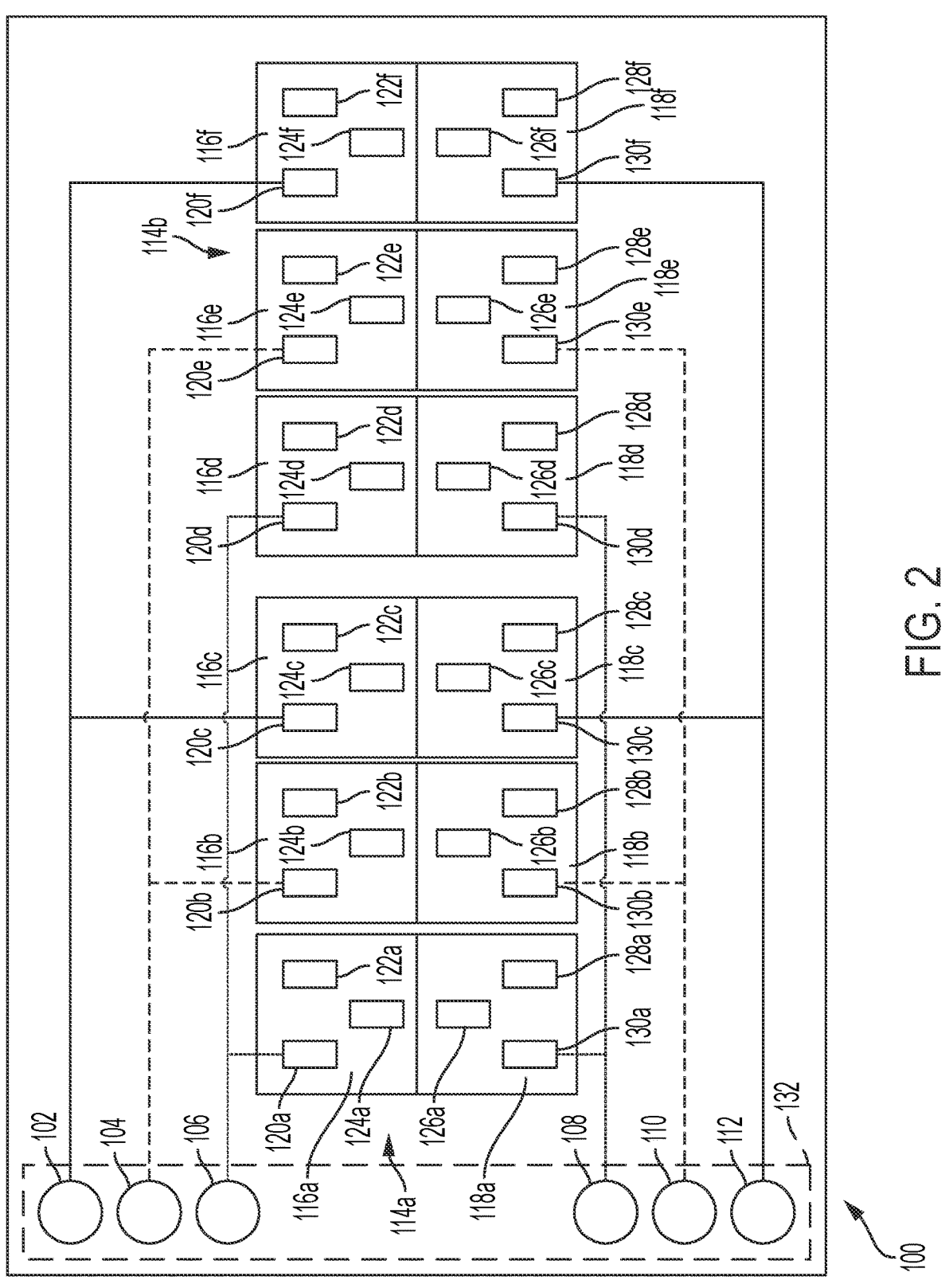
FIG. 2 illustrates a schematic diagram of a power distribution unit according to an example.

The configuration system 16 is configured to route different phases of power to different outlets in the PDU 18. Accordingly, the configuration system 16 may determine which outlets output which phases of power. The configuration system 16 may also determine the relative voltages between the source and return paths for a given outlet, as discussed in greater detail with respect to FIGS. 3-5. The configuration system 16 may also be modular and/or configurable (that is, the configuration system 16 may be removed and/or replaced without damaging the PDU 18, such that the configuration system 16 may be considered "plug-and-play"), such that the connections provided by the configuration source 16 between the PDU 18 and the power source 12 may be changed FIG. 2 illustrates a schematic diagram of a power distribution unit 100 ("PDU 100") for evenly distributing power to one or more loads according to an example. The PDU 100 may be configured such that any given set of outlets can provide balanced power to one or more loads. In general, for any phase configuration of the power source (one-phase, two-phase, three-phase, and so forth) the average power provided to a given outlet and/or receptacle will be approximately equal for each outlet and/or receptacle.

The PDU 100 includes a first source contact 102, a second source contact 104, a third source contact 106, a first return contact 108, a second return contact 110, a third return contact 112, a first plurality of outlets 114a, a second plurality of outlets 114b, and a phase selection interface 132. As discussed in greater detail below, the return contacts 108-112 may be coupled to a return connection (for example, a neutral or ground connection) in some examples. For example, in a configuration based on a wye topology, the return contacts 108-112 may be coupled to a return connection. In other examples, the return contacts 108-112 may be coupled to a source of a phase of power. For example, in a configuration based on a delta topology, the return contacts 108-112 may each be coupled to a source of a respective phase of power. Thus, while the return contacts 108-112 may be referred to herein as "return" contacts, the return contacts 108-112 may not be coupled to a return connection and may instead be coupled to a source of a phase of power in some examples.

The first plurality of outlets 114a includes a first receptacle 116a, a second receptacle 118a, a third receptacle 116b, a fourth receptacle 118b, a fifth receptacle 116c, and a sixth receptacle 118c. The first receptacle 116a includes a first opening 120a, a second opening 122a, and a third opening 124a. The second receptacle 118a includes a first opening 126a, a second opening 128a, and a third opening 130a. The third receptacle 116b includes a first opening 120b, a second opening 122b, and a third opening 124b. The fourth receptacle 118b includes a first opening 126b, a second opening 128b, and a third opening 130b. The fifth receptacle 116c includes a first opening 120c, a second opening 122c, and a third opening 124c. The sixth receptacle 118c includes a first opening 126c, a second opening 128c, and a third opening 130c.

The second plurality of outlets 114b includes a first receptacle 116d, a second receptacle 118d, a third receptacle 116e, a fourth receptacle 118e, a fifth receptacle 116f, and a sixth receptacle 118f. The first receptacle 116d includes a first opening 120d, a second opening 122d, and a third opening 124d. The second receptacle 118d includes a first opening 126d, a second opening 128d, and a third opening 130d. The third receptacle 116e includes a first opening 120e, a second opening 122e, and a third opening 124e. The fourth receptacle 118e includes a first opening 126e, a second opening 128e, and a third opening 130e. The fifth receptacle 116f includes a first opening 120f, a second opening 122f, and a third opening 124f. The sixth receptacle 118f includes a first opening 126f, a second opening 128f, and a third opening 130f.

In the example of FIG. 1, each pair of receptacles constitutes an outlet. Thus, the first receptacle 116a and second receptacle 118a are a first outlet, the third receptacle 116b and fourth receptacle 118b are a second outlet, the fifth receptacle 116c and sixth receptacle 118c are a third outlet, the first receptacle 116d and second receptacle 118d are the fourth outlet, the third receptacle 116e and fourth receptacle 118e are a fifth outlet, and the fifth receptacle 116f and sixth receptacle 118f are a sixth outlet.

With respect to the first plurality of outlets 114a, the first opening 120a of the first receptacle 116a is coupled to the third source contact 106 and the third opening 130a of the second receptacle 118a is coupled to the first return contact 108. The other outlets of the first receptacle 116a and second receptacle 118a may be coupled to ground or neutral, or may be left floating (that is, not connected to anything).

With respect to the first plurality of outlets 114a, the first opening 120b of the third receptacle 116b is coupled to the second source contact 104, and the third opening 130b of the fourth receptacle 118b is coupled to the second return contact 110. The other outlets of the third receptacle 116b and fourth receptacle 118b may be coupled to ground or neutral, or may be left floating (that is, not connected to anything).

With respect to the first plurality of outlets 114a, the first opening 120c of the fifth receptacle 116c is coupled to the first source contact 102, and the third opening 130c of the sixth receptacle 118c is coupled to the third return contact 112. The other outlets of the fifth receptacle 116c and sixth receptacle 118c may be coupled to ground or neutral, or may be left floating (that is, not connected to anything).

With respect to the second plurality of outlets 114b, the first opening 120d of the first receptacle 116d is coupled to the third source contact 106 and the third opening 130d of the second receptacle 118d is coupled to the first return contact 108. The other outlets of the first receptacle 116d and second receptacle 118d may be coupled to ground or neutral, or may be left floating (that is, not connected to anything).

With respect to the second plurality of outlets 114b, the first opening 120e of the third receptacle 116e is coupled to the second source contact 104, and the third opening 130e of the fourth receptacle 118e is coupled to the second return contact 110. The other outlets of the third receptacle 116e and fourth receptacle 118e may be coupled to ground or neutral, or may be left floating (that is, not connected to anything).

With respect to the second plurality of outlets 114b, the first opening 120f of the fifth receptacle 116f is coupled to the first source contact 102, and the third opening 130f of the sixth receptacle 118f is coupled to the second return contact third return contact 112. The other outlets of the fifth receptacle 116f and sixth receptacle 118f may be coupled to ground or neutral, or may be left floating (that is, not connected to anything).

In some examples, each outlet may include only a single receptacle (as opposed to more than one receptacle). For example, each outlet of the first plurality of outlets 114a could have a single receptacle (for example, the first, third, and fifth receptacles 116a-c). In such cases, the respective second openings 122a-c of those outlets could be coupled to a respective phase of power. For example, the second opening 122a of the first receptacle 116a could be coupled to the first return contact 108, the second opening 122b of the third receptacle 116b could be coupled to the second return contact 110, and the second opening 122c of the fifth receptacle 116c could be coupled to the third return contact 112.

With respect to FIG. 1, the first plurality of outlets 114a may be a first set of outlets for a three-phase power system, and the second plurality of outlets 114b may be a second set of outlets for a three-phase power system. In some examples, the first plurality of outlets 114a and second plurality of outlets 114b may be outlets for a multiphase power system having less than or more than three phases of power. In such examples, the number of outlets in each plurality of outlets 114a, 114b may be increased or decreased to be equal to a multiple of the number of phases of power in the multiphase power system.

In some examples, the source contacts 102-106 and return contacts 108-112 are part of a phase selection interface 132. The phase selection interface 132 may be an interface configured to receive the configuration system 16 so that the contacts 102-112 can be connected to the desired phase of input power and/or to a return connection (for example, a neutral or ground connection). In some examples, the phase selection interface 132 may be configured to retain the configuration system 16 in a set position until the configuration system 16 is removed by a user.

Figure 3:
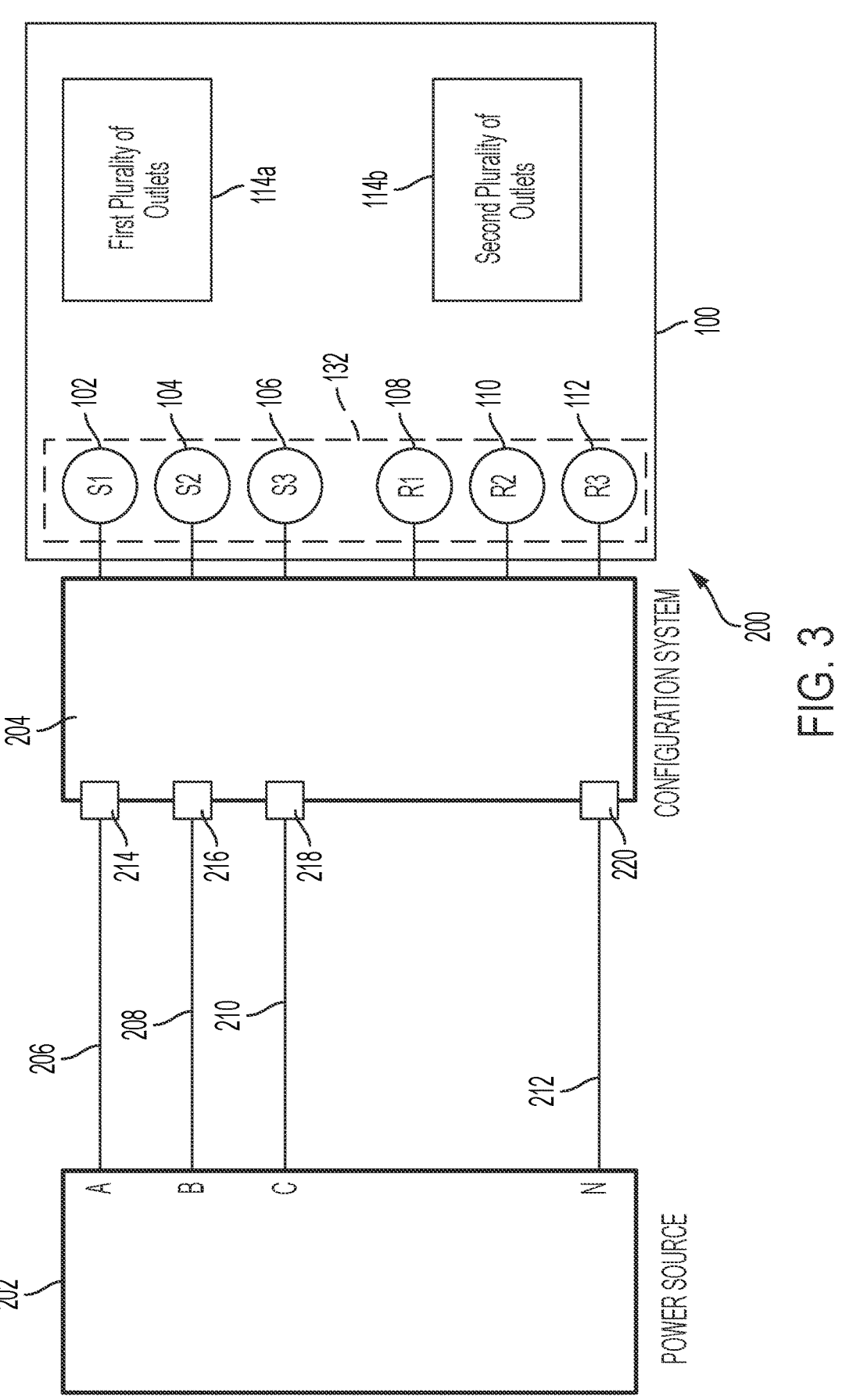
FIG. 3 illustrates a schematic diagram of a power system according to an example.

FIG. 3 illustrates a schematic diagram of a power system 200 according to an example. The power system 200 illustrates a power source 202 connected to a configuration system 204. The configuration system 204 acts as an intermediary between the power source 202 and the PDU 100 (here illustrated in part by the source and return contacts 102-112), and determines which phases of power are routed to and/or from which of the contacts 102-112. The configuration system 204 may be modular, and thus may be replaceable or removeable, as will be discussed in greater detail below. In various examples, the modularity of the configuration system 204 allows the single PDU 100 to provide multiple configurations of output power to connected loads. For example, if the configuration system 204 connects the contacts 102-112 to the power source 202 such that the PDU 100 is in a delta configuration, the PDU 100 can provide phases of power to the loads that match the phases of power available from a delta-configured PDU. Likewise, if the configuration system 204 connects the contacts 102-112 to the power source 202 such that the PDU 100 is in a wye configuration, the PDU 100 can provide phases of power to connected loads that match the phases of power available from a wye-configured PDU.

The configuration system 204 includes a first input 214, a second input 216, a third input 218, and a return connection 220. The power system 200 includes a first conductive path 206 coupling the power source 202 to the first input 214, a second conductive path 208 coupling the power source 202 to the second input 216, a third conductive path 210 coupling the power source 202 to the third input 218, and a fourth conductive path 212 coupling the power source 202 to the return connection 220.

The power source 202 is coupled to the first conductive path 206 at a first connection, to the second conductive path 208 at a second connection, to the third conductive path 210 at a third connection, and to the fourth conductive path 212 at a fourth connection. The first conductive path 206 is coupled to the power source 202 at a first connection and to the first input 214 at a second connection. The second conductive path 208 is coupled to the power source 202 at a first connection and to the second input 216 at a second connection. The third conductive path 210 is coupled to the power source 202 at a first connection and to the third input 218 at a second connection. The fourth conductive path 212 is coupled to the power source 202 at a first connection and to the return connection 220 at a second connection. The configuration system 204 includes the first input 214, the second input 216, the third input 218, and the return connection 220, and may be further coupled to the first source contact 102 at a first connection, the second source contact 104 at a second connection, the third source contact 106 at a third connection, the first return contact 108 at a fourth connection, the second return contact 110 at a fifth connection, and/or the third return contact 112 at a sixth connection.

The power source 202 may provide one or more phases of power. In FIG. 3, the power source 202 is illustrated as a three-phase power source, providing an "A," "B," and "C"

phases of power to the configuration system 204, as well as having a neutral connection "N" connected to the configuration system 204. The "A" phase of power is provided to the configuration system 204 via the first conductive path 206 and the first input 214. The "B" phase of power is provided to the configuration system 204 via the second conductive path 208 and the second input 216. The "C" phase of power is provided to the configuration system 204 via the third conductive path 210 and the third input 218. The neutral line, "N." is connected to the configuration system 204 via the fourth conducting path 212 and the return connection 220.

When the power source 202 is providing power, the power source 202 may provide the "A," "B." and "C" phases of power to the configuration system 204. The configuration system 204 then routes the phases of power to one or more of the contacts 102-112. The configuration system 204 can route the phases of power however desired. For example, the configuration system 204 may route any phase of power to any of the source or return contacts 102-112. Various connections will be described in more detail with respect to FIGS. 4 and 5. The configuration system 204 can facilitate any power configuration, including delta and wye configurations for three-phase power, as well as any desired configurations for one-phase, two-phase, four-phase power, and so on by providing connections and/or conducting paths between inputs (for example, the inputs 214-218), return connection(s) (for example, the return connection 220), and contacts (for example, the contacts 102-112).

In some examples, where the power system includes fewer than or more than three phases of power, the number of conducting paths and connections for the conducting paths, as well as the number of inputs into the configuration system 204, may be increased or decreased to equal the number of phases of power.

Figure 4:
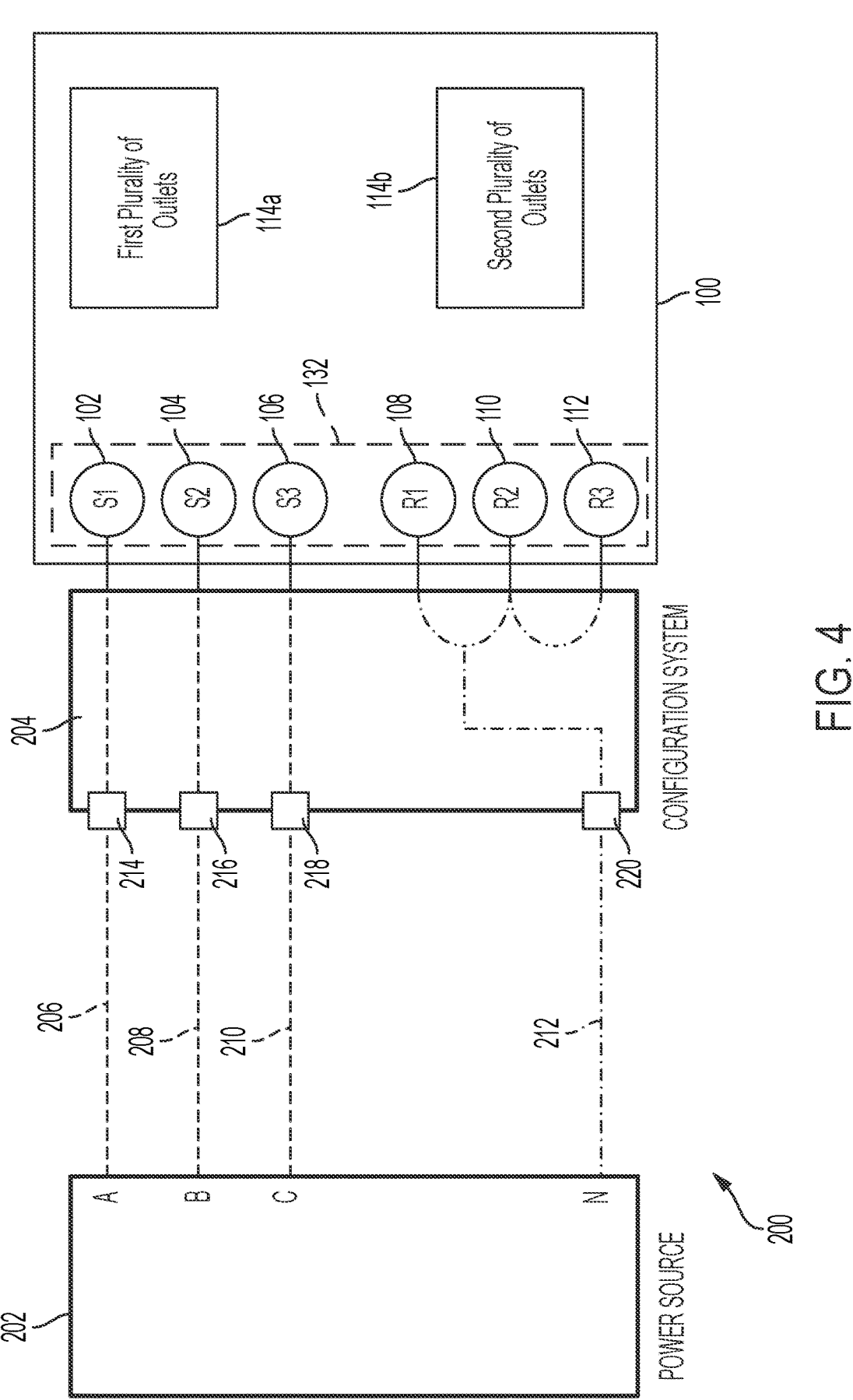
FIG. 4 illustrates a schematic diagram of a power system according to an example.

FIG. 4 illustrates a schematic diagram of the power system 200 in a wye configuration according to an example. In many wye configurations, the output voltage for each output is measured with respect to neutral (or ground). Thus, in many wye configurations, the return path may be through a neutral line (though wye configurations that do not have neutral lines also exist and may be implemented on the power system 200).

In FIG. 4, the first input 214 is coupled, via the configuration system 204, to the first source contact 102. The second input 216 is coupled, also via the configuration system 204, to the second source contact 104. The third input 218 is coupled, also via the configuration system 204, to the third source contact 106. The return connection 220 is coupled to the first return contact 108, the second return contact 110, and the third return contact 112.

In various examples, the configuration system 204 may include conductive paths, such as conductive traces, to couple the inputs 214-218 and the return connection 220 to desired ones of the contacts 102-112. Thus, the routing of the conductive paths within the configuration system 204 may dictate how power provided by the power source 202 is distributed to the PDU 100. Because the configuration system 204 is modular and may be easily replaced by a different configuration system with different conductive-path routings, a designer of the power system 200 may easily change how power from the power source 202 is distributed to the PDU 100 by re-configuring or replacing the configuration system 204.

Returning to FIG. 2 with reference to the topology of the configuration system 204 illustrated in FIG. 4, because each return contact 108-112 is coupled to the neutral line "N" of the power source 202 via the configuration system 204, each of the third openings 130a-f may also be coupled to the neutral line "N" of the power source 202. Each of the first openings 120a, 120d of the first receptacles 116a, 116d may be coupled to the third source contact 106, each of the first openings 120b, 120e may be coupled to the second source contact 104, and each of the first openings 120c. 120f of the fifth receptacles 116c. 116f may be coupled to the first source contact 102. As a result, the first outlet of each plurality of outlets 114a, 114b is connected between the "C" phase of power and the "N" line, the second outlet of each plurality of outlets 114a. 114b is connected between the "B" phase of power and the "N" line, and the third outlet of each plurality of outlets 114a, 114b is connected between the "A" phase of power and the "N" line. Thus, each outlet of a given plurality of outlets 114a, 114b provides a different phase of power, with the maximum voltage differentials for each phase of power being equal to the difference between the maximum voltage differential of "A" and "N," "B" and "N." and/or "C" and "N."

Figure 5:
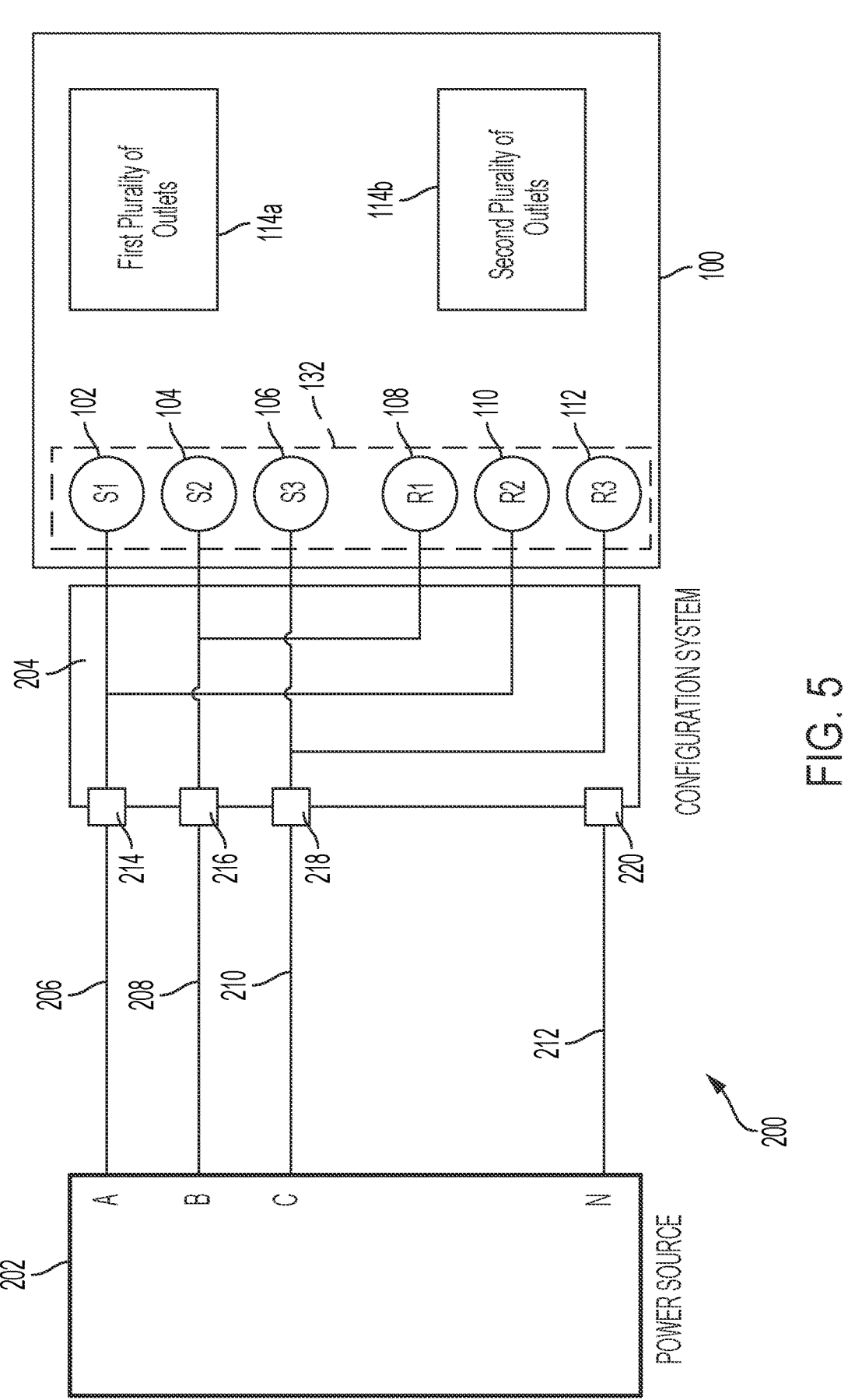
FIG. 5 illustrates a schematic diagram of a power system according to an example.
Figure 6:
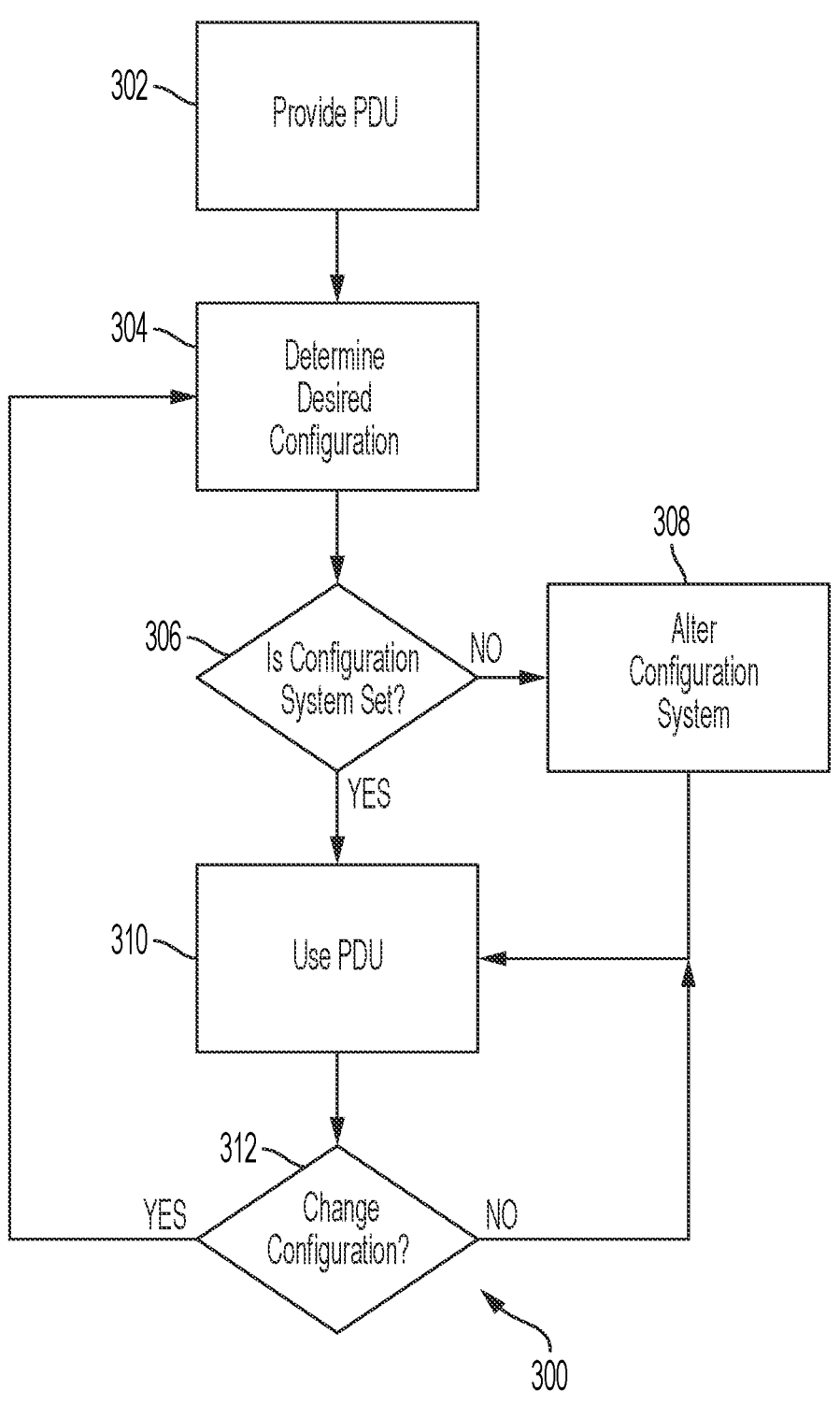
FIG. 6 illustrates a process for managing a power distribution unit according to an example.

FIG. 5 illustrates a schematic diagram of the power system 200 coupled in a delta configuration according to an example. In many delta configurations, no neutral connection is present. Instead, the outputs are defined by differential relationships between three phases of power.

In FIG. 5, the configuration system 204 is configured such that first input 214 is coupled to the first source contact 102 and the second return contact 110. The second input 216 is coupled to the second source contact 104 and the first return contact 108. The third input 218 is coupled to the third source contact 106 and the third return contact 112. The return connection 220 may not be coupled to any source or return contact. For example, the configuration system 204 may not route the return connection 220 to any contact.

Returning to FIG. 2 with reference to the topology of the configuration system 204 illustrated in FIG. 5, each of the first openings 120a, 120d of the first receptacles 116a, 116d may be coupled to the third source contact 106, and each of the third openings 130a, 130d of the second receptacles 118a. 118d may be coupled to the first return contact 108. Accordingly, each first outlet (that is, the outlet containing the first receptacles 116a, 116d and the second receptacles 118a, 118d) is coupled between the "B" and "C" phases of power.

Similarly, each of the first openings 120b, 120e of the third receptacles 116b, 116e may be coupled to the second source contact 104, and each of the third openings 130b, 130e of the fourth receptacles 118b, 118e may be coupled to the second return contact 110. As a result, the second outlets (that is, the outlets containing the third receptacles 116b, 116e and the fourth receptacles 118b, 118e) are coupled between "A" and "B" phases of power.

Likewise, each of the first openings 120c. 120f of the fifth receptacles 116c. 116f may be coupled to the first source contact 102, and each of the third openings 130c, 130f of the sixth receptacles 118c. 118f may be coupled to the third return contact 112. As a result, the third outlets (that is, the outlets containing the fifth receptacles 116c. 116f and the sixth receptacles 118c, 118f) are coupled between the "A" and "C" phases of power.

FIG. 5 illustrates a process 300 of managing the configuration of the PDU 100.

At act 302, a user or other entity provides a PDU 100 for use in a location, such as a datacenter, a server room, a server rack, or any other location where the provision of electricity is desirable or wanted. The process 300 then continues to act 304.

At act 304, the user or a controller determines the desired configuration of the PDU 100. For example, the user may determine that a delta or wye configuration is desired, or that some other configuration for multiphase power is desired. Once the desired configuration is determined by the user, the process 300 continues to act 306.

At act 306, the user or a controller determines if the configuration system 16 is set to configure the PDU 100 such that the PDU 100 will be in the desired configuration. For example, if the desired configuration is a delta configuration, act 306 may include determining whether the configuration system 16 has a topology to configure the PDU 100 in a delta configuration (for example, as illustrated in FIG. 5). If the configuration system 16 does not have a desired topology (306 NO), the process 300 may continue to act 308. If the configuration system 16 has a desired topology (306 YES), then the process 300 may continue to act 310.

At act 308, the user or controller may alter the configuration system 16. Altering the configuration system 16 may include changing the conductive paths within the configuration system 16, and/or may include replacing the configuration system 16 with a different configuration system with a different topology. If the configuration system 16 is modularly connected to the PDU 100 (that is, interchangeable with respect to the PDU 100), the configuration system 16 may be replaced with another configuration system having a desired configuration. For example, the configuration system 16 may be removed from a slot, bracket, cradle, pin, or any other holder that allows the configuration system 16 to be interfaced with the PDU 100. If the configuration system 16 includes a circuit, controller, or other device that can control the configuration of the PDU 100 without being removed, the configuration system 16 may adjust its conductive paths as needed and/or desired to cause the configuration system 16 to have a desired topology. The process 300 may then continue to act 310.

At act 310, the PDU 100 may be placed into operation. For example, the PDU 100 may be coupled to one or more loads via the outlets 114a, 114b. The PDU 100 may then provide power to the loads pursuant to the configuration set by the configuration system 204. The process 300 may then continue to act 312.

At act 312, the user or controller may determine whether the configuration of the PDU 100 should be changed. For example, the PDU 100 may have been providing power to loads requiring a first power configuration (for example, according to a delta configuration), but now may require a second power configuration (for example, according to a wye configuration). If the configuration of the PDU 100 does not need to be changed (312 NO), the process 300 may return to act 310. If the configuration of the PDU 100 should be changed (312 YES), the process 300 may return to act 304.

The configuration systems 16, 204 may be implemented according to a variety of methods and systems. For example, the configuration system 16, 204 may be a printed circuit board (PCB) configured to be modular (that is, to be installable in and/or removeable from the power distribution system 14 and/or the PDUs 18, 100). As a PCB, the configuration systems 16, 204 may include electrical traces (for example, lines of conductive material) that connect a contact to an input to receive one of the phases of power. In another examples, the configuration systems 16, 204 may include a switching circuit, for example, a circuit containing switching devices (such as transistors) that allow the configuration systems 16, 204 to selectively connect switches to different inputs to receive different phases of power. In some examples, the configuration systems 16, 204 may be controllable by a controller or other control circuitry (for example, configuration registers that can be used to set how the configuration systems 16, 204 operate and/or connect contacts to inputs to receive phases of power).

In some examples, the configuration systems 16, 204, as a modular system, may be changed based on the needs of the loads 20 and/or power source 12. For example, in one situation, the PDUs 18, 100 may be required to provide power according to a delta configuration. Accordingly, the configuration systems 16, 204 may be provided to configure the PDU 18, 100 to provide power according to a delta configuration. Later, the loads 20 may benefit from or require wye-configuration power. Accordingly, the configuration systems 16, 204 may be reconfigured such that the PDUs 18, 100 provide power according to a wye configuration, or the configuration systems 16, 204 may be removed and replaced with a configuration system that configure the PDU 18, 100 to provide power according to a wye configuration. All of this may be accomplished without changing the power source 12 or the PDUs 18, 100.

With respect to the foregoing, in some examples third openings 124*a-f* and/or first openings 126*a-f* may be coupled to a ground connection. The ground connection may be an integrated part of the PDU 100 (that is, the ground connection may not be determined by the phase selection interface 132 or configuration system 16, 204.

Various controllers may execute various operations discussed above. Using data stored in associated memory and/or storage, the controller may also execute one or more instructions stored on one or more non-transitory computer-readable media, which the controller may include and/or be coupled to, that may result in manipulated data. In some examples, the controller may include one or more processors or other types of controllers. In one example, the controller is or includes at least one processor. In another example, the controller performs at least a portion of the operations discussed above using an application-specific integrated circuit tailored to perform particular operations in addition to, or in lieu of, a general-purpose processor. As illustrated by these examples, examples in accordance with the present disclosure may perform the operations described herein using many specific combinations of hardware and software and the disclosure is not limited to any particular combination of hardware and software components. Examples of the disclosure may include a computer-program product configured to execute methods, processes, and/or operations discussed above. The computer-program product may be, or include, one or more controllers and/or processors configured to execute instructions to perform methods, processes, and/or operations discussed above.

Having thus described several aspects of at least one embodiment, it is to be appreciated various alterations, modifications, and improvements will readily occur to those skilled in the art. Such alterations, modifications, and improvements are intended to be part of, and within the spirit and scope of, this disclosure. Accordingly, the foregoing description and drawings are by way of example only.

What is claimed is:

1. A power distribution unit (PDU) comprising:
a phase selection interface having:
a first source contact configured to couple to a configuration system,
a first return contact configured to couple to the configuration system,
a second source contact configured to couple to the configuration system, and a second return contact configured to couple to the configuration system, wherein the configuration system includes a controller to set a plurality of power output configurations of the PDU for the phase selection interface;
a first outlet having:
a first opening coupled to the first source contact, and
a second opening coupled to the first return contact; and
a second outlet having:
a third opening coupled to the second source contact, and
a fourth opening coupled to the second return contact.

2. The PDU of claim 1, wherein the configuration system is configured to conductively link at least one source contact to at least one input configured to provide a phase of input power.

3. The PDU of claim 1, wherein the configuration system is configured to conductively link at least one return contact to at least one input configured to provide a phase of input power.

4. The PDU of claim 1, wherein the configuration system is configured to conductively link at least one source contact or at least one return contact to a neutral or ground line.

5. The PDU of claim 1, further comprising one or more additional outlets, each additional outlet having a fifth opening coupled to a source contact of the phase selection interface and a sixth opening coupled to a return contact of the phase selection interface.

6. The PDU of claim 1, further comprising one or more additional outlets, wherein a total number of outlets of the PDU equals an integer multiple of a total number of phases of input power received by the PDU.

7. The PDU of claim 6, wherein the total number of phases of input power is three and the total number of outlets of the PDU is a multiple of three.

8. The PDU of claim 1, wherein each outlet includes a first receptacle and a second receptacle, each respective first receptacle including a respective fifth opening coupled to a source contact of the phase selection interface, and each respective second receptacle including a respective sixth opening coupled to a return contact of the phase selection interface.

9. The PDU of claim 8, wherein each receptacle includes three openings.

10. The PDU of claim 1, wherein to set the plurality of power output configurations of the PDU, the controller is configured to change one or more conductive paths within the configuration system based at least in part on respective power output configurations of the plurality of power output configurations.

11. The PDU of claim 1, wherein the controller is configured to:
determine the configuration system has a topology to configure the PDU in a power output configuration of the plurality of power output configurations; and
change, based at least in part on the power output configuration, one or more conductive paths within the configuration system to the topology.

12. The PDU of claim 1, wherein the plurality of power output configurations include at least one of a delta configuration or a wye configuration.

13. The PDU of claim 1, wherein the configuration system includes a switching circuit selectively connectable by the controller to different inputs to receive different phases of input power.

14. The PDU of claim 1, wherein the plurality of power output configurations is set based at least in part on a single configuration of the phase selection interface.

\* \* \* \* \*